United States Patent [19]

Takahashi

[11] Patent Number: 5,723,895
[45] Date of Patent: Mar. 3, 1998

[54] FIELD EFFECT TRANSISTOR FORMED IN SEMICONDUCTOR REGION SURROUNDED BY INSULATING FILM

[75] Inventor: Kenichiro Takahashi, Tokyo, Japan

[73] Assignee: NEC Corporation, Tokyo, Japan

[21] Appl. No.: 724,818

[22] Filed: Oct. 2, 1996

[30] Foreign Application Priority Data

Dec. 14, 1995 [JP] Japan .................. 7-325467

[51] Int. Cl.$^6$ ............................................ H01L 29/06
[52] U.S. Cl. ..................... 257/499; 257/501; 257/502; 257/506; 257/524; 257/347; 257/350
[58] Field of Search ......................... 257/524, 499, 257/500, 501, 502, 506, 347, 350, 354

[56] References Cited

U.S. PATENT DOCUMENTS

| | | | |
|---|---|---|---|
| 4,300,150 | 11/1981 | Colak | 257/339 |
| 5,113,236 | 5/1992 | Arnold et al. | 257/347 |
| 5,382,818 | 1/1995 | Pein | 257/347 |
| 5,554,870 | 9/1996 | Fitch et al. | 257/350 |
| 5,608,252 | 3/1997 | Nalato | 257/347 |

FOREIGN PATENT DOCUMENTS

| | | | |
|---|---|---|---|
| 58-003286 | 1/1983 | Japan | 257/347 |
| 63-067779 | 3/1988 | Japan | 257/347 |
| 3-214773 | 9/1991 | Japan | 257/347 |
| 4-29353 | 1/1992 | Japan . | |

OTHER PUBLICATIONS

K.Kobayashi et al., "An Intelligent Power Device Using Poly-Si Sandwiched Wafer Bonding Technique", *Proceedings of 1995 International Symposium on Power Semiconductor Devices & ICs*, pp. 58-62.

*Primary Examiner*—Tom Thomas
*Assistant Examiner*—David B. Hardy
*Attorney, Agent, or Firm*—Sughrue, Mion, Zinn, Macpeak & Seas, PLLC

[57] ABSTRACT

A field effect semiconductor device includes a first semiconductor region of a first conductive type and a second semiconductor region of a second conductive type provided above the first semiconductor region. A dielectric film is interposed between the first semiconductor region and the second semiconductor region to surround the second semiconductor region and to have at least one opening portion for connecting the second semiconductor region to the first semiconductor region. A field effect transistor is provided, in which a source region is provided in a surface portion of the second semiconductor region and connected to a source electrode and a drain region is provided in the surface portion of the second semiconductor region and connected to a drain electrode. A gate electrode provided between the source region and the drain region to form a channel region. In this case, it is preferred that the drain region, the gate and the source region are provided apart from a portion vertically corresponding to the opening portion.

18 Claims, 8 Drawing Sheets

1

FIELD EFFECT TRANSISTOR FORMED IN SEMICONDUCTOR REGION SURROUNDED BY INSULATING FILM

BACKGROUND OF THE INVENTION

1. Field of the Invention

The present invention relates to a semiconductor device, and more particularly to a semiconductor device using an FET with a high breakdown voltage.

2. Description of Related Art

An integrated circuit for driving an electronic display apparatus such as a plasma display panel (PDP) and an electroluminescence display (ELD) and so on is typically composed of a control logic section including transistors with low breakdown voltages and an output section including transistors with high breakdown voltages. Also, the integrated circuit has the CMOS circuit structure to reduce the amount of wasteful power consumption as small as possible. In this case, it is desirable that a transistor is a high breakdown voltage lateral double diffusion MOSFET (HVLDMOS FET). For instance, the HVLDMOS FET has the structure in which a P-channel area is formed at the surface portion of an N-type epitaxial layer deposited on a P-type silicon substrate, an $N^+$-type source area and an $N^+$-type drain area are at the surface portion of the N-type epitaxial layer, and a gate electrode is formed via a gate insulating film on the surface of the P-type channel area sandwiched by the $N^+$-type source area and the $N^+$-type drain area.

An improvement of the above basic HVLDMOS FET is described in U.S. Pat. No. 4,300,150. In the HVLDMOS FET, an electric field adjusting layer or a field-shaping layer which has the impurity doping level higher than that of a P-type silicon substrate is provided between the surface portion of an N-type epitaxial layer and the P-type silicon substrate. The electric field in neighborhood of the PN-junction between the P-type channel area and the N-type epitaxial layer is weakened. Also, the electric field in neighborhood of the $N^+$-type drain area is strengthened. In this manner, the electric field distribution is made uniform so that the above-mentioned avalanche breakdown is difficult to occur in neighborhood of the PN-junction. Thus, the breakdown voltage and on-resistance characteristic can be improved in the HVLDMOS FET.

In the above-mentioned HVLDMOS FET and the improvement, the breakdown voltage and on-resistance are improved by intendedly utilizing a depletion layer extending to the N-type epitaxial layer. In a case that the HVLDMOS FET is integrated together with a plurality of types of elements, the well-known self-separation structure or PN-junction separation structure is used. Because the former requires a large distance between elements for the high breakdown device such as the above-mentioned ELD driving integrated circuit, so that the integrating density is difficult to be increased. Therefore, the latter is usually used. In a case that the CMOS structure is employed even if the PN-junction separation structure is used, there is a problem of an erroneous operation and degradation in characteristics and reliability due to parasitic bipolar transistors. The problem will be described below using an example.

FIGS. 1A and 1B are a cross sectional view and an equivalent circuit diagram illustrating an example of conventional high breakdown voltage CMOS output circuit. Referring to FIGS. 1A and 1B, a source electrode $S_p$ and drain electrode $D_p$ of a P-channel HVLDMOS FET $T_p$ are connected to a power supply higher voltage wiring $V_{DD2}$ and a drain electrode $D_n$ of an N-channel HVLDMOS FET $T_n$, respectively. A source electrode $S_n$ of the N-channel HVLDMOS FET $T_n$ is connected to the power supply lower voltage wiring $V_{ss2}$. The drain electrodes $D_p$ and $D_n$ are connected in common and are led to an output terminal OUT. In the above circuit, there are a parasitic PNP bipolar transistor $Q_1$ and a parasitic NPN bipolar transistor $Q_2$.

The N-channel HVLDMOS FET $T_n$ is formed to have the same structure that proposed in the above-mentioned U.S. Pat. No. 4,300,150. That is, the N-channel HVLDMOS FET $T_n$ has a P-type channel region 7 formed in the surface portion of an N-type epitaxial layer 2 which is segmented by the P-type silicon substrate 1 and $P^+$-type separation regions 5. The N-channel HVLDMOS FET $T_n$ further includes an $N^+$-type drain region $9_n$, and an $N^+$-type source region $8_n$ formed in the surface portion of the P-type channel region 7. P-type diffusion layers 3 and 10 are electric field adjusting layers or field-shaping layers with an impurity doping level higher than that of the P-type silicon substrate 1.

The P-channel HVLDMOS FET $T_p$ includes a $P^+$-type source region $8_p$, a $P^+$-type drain region $9_{p-1}$, a P-type drain region $9_{p-2}$, and an $N^+$-type contact region 13 which are formed in the surface portion of the N-type epitaxial layer 2 which is segmented by the P-type silicon substrate 1 and the $P^+$-type separation regions 5. The P-channel HVLDMOS FET $T_p$ further includes an $N^+$-type diffusion layer 4 buried between the N-type epitaxial layer 2 and the P-type silicon substrate 1. In the P-channel HVLDMOS FET $T_p$, because holes is carriers, the avalanche breakdown in the silicon layer is difficult to occur, i.e., the high breakdown voltage structure can be relatively simply accomplished.

The parasitic PNP transistor $Q_1$ is formed to have the P-type silicon substrate 1 as a collector, the N-type epitaxial layer 2 (in which MOS transistor $T_p$ is formed) as a base, and the $P^+$-type drain region $9_{p-1}$ as an emitter. Also, the parasitic NPN transistor $Q_2$ is formed to have the N-type epitaxial layer 2 (in which the MOS FET $T_p$ is formed) as a collector, the $P^+$-type separation region 5 as a base, and the N-type epitaxial layer 2 (in which the MOS FET $T_n$ is formed) as an emitter.

The parasitic PNP transistor $Q_1$ is turned on when the potential of the output terminal OUT is made higher than power supply higher potential $V_{DD2}$ due to any causes. At this time current flows through the bulk and the bulk has high breakdown voltage. Accordingly, there is no problem. However, in column drive circuit for an AC drive thin film EL (AC-TFEL) device, the power supply voltages $V_{DD2}$ and $V_{ss2}$ are periodically changed due to the current. In a case where, for example, the power supply voltage $V_{DD2}$ is 210 V, the power supply voltage $V_{ss2}$ is substantially equal to the ground potential, the P-channel HVMOS FET $T_p$ is turned on and the N-channel HVMOS FET is turned off, so that the output voltage OUT is in the "H" state, if the parasitic PNP transistor $Q_1$ is turned on in the first stage discharge for the positive write, i.e., in an operation mode in which the power supply voltage is decreased to 125 V, the potential wave form of the power supply higher potential $V_{DD2}$ is distorted so that the quality of displayed screen would be also degraded. Next, when the potential of the output terminal OUT is made lower than the power supply lower potential $V_{ss2}$, the parasitic NPN transistor $Q_2$ is turned on. In this case, a part of current flows through the interface of a field insulating film 6 such that there is a case that the insulation is broken. In the AC-TFEL device, there is a state in which the power supply higher potential $V_{DD2}$ is in a floating state, the power supply lower potential is −170 V, the N-channel HVLDMOS FET $T_n$ is in the ON state, and the P-channel HVMOS FET $T_p$ is in the OFF state. In the AC-TFEL device, there is the first stage discharge for negative write, i.e., an operation mode in which the power supply higher potential $V_{DD2}$ is downed to the ground potential and the power supply lower potential $V_{ss2}$ is raised to $-150$ V. At this time, the sufficiently large breakdown voltage cannot be provided.

The high breakdown voltage drive circuit is usually integrated on the same substrate on which a CMOS control logic circuit is mounted which is driven with a power supply voltage of about 5 V ($V_{DD1}=5$ V and $V_{ss1}=0$ V). It would be not needed to be described in detail that a latch up problem occurs in the CMOS control logic circuit if the PN-junction separation structure is used.

These problems can be considerably eliminated if dielectric isolation structure is used. However, as above-mentioned, the dielectric isolation structure is not well-suited with the HVLDMOS FET.

SUMMARY OF THE INVENTION

Therefore, an object of the present invention is to provide a field effect semiconductor device which includes high breakdown voltage MOS FETs well suited to the dielectric isolation structure while the merits of a HVLDMOS FET are left.

Another object of the present invention is to provide a method for manufacturing such a semiconductor device.

In order to achieve an aspect of the present invention, a field effect semiconductor device includes a first semiconductor region of a first conductive type, a second semiconductor region of a second conductive type provided above the first semiconductor region, a dielectric film interposed between the first semiconductor region and the second semiconductor region to surround the second semiconductor region and to have at least one opening portion for connecting the second semiconductor region to the first semiconductor region, a source region provided in a surface portion of the second semiconductor region and connected to a source electrode, a drain region provided in the surface portion of the second semiconductor region and connected to a drain electrode, and a gate electrode provided between the source region and the drain region to form a channel region.

It is preferred that the drain region, the gate and the source region are provided apart from a portion vertically corresponding to the opening portion.

When the gate electrode is provided on the surface portion of the second semiconductor region via a gate insulating film and the source region is the second conductive type, a third semiconductor region of the first conductive type is connected to the source electrode and is provided in the surface portion of the second semiconductor region such that the source region is surrounded by the third semiconductor region and such that the third semiconductor region extends below the gate electrode. A fourth semiconductor region of the first conductive type may be further provided at the opening portion and in a peripheral portion of the opening portion. The same voltage as the source electrode is applied to the fourth semiconductor region. In this case, a pinch off voltage with which a depletion layer extending from the fourth semiconductor region reaches the surface of the second semiconductor region is lower than a breakdown voltage between the fourth semiconductor region and the drain region.

Further, when a fifth semiconductor region of the first conductive type is provided in the surface portion of the second semiconductor region vertically corresponding to the fourth semiconductor region, the fifth semiconductor region is applied with the same voltage as the source electrode. In this case, a pinch off voltage with which a depletion layer extending from the fourth semiconductor region reaches a depletion layer extending from the fifth semiconductor region is lower than a breakdown voltage between the fourth semiconductor region and the drain region and a breakdown voltage between the third semiconductor region and the second semiconductor region.

In addition, a sixth semiconductor region of the first conductive type may be provided in the second semiconductor region such that the fourth semiconductor region is surrounded by the sixth semiconductor region, and a seventh semiconductor region of the second conductive type may be provided in the second semiconductor region such that the fifth semiconductor region is surrounded by the seventh semiconductor region and such that a part of the seventh semiconductor region overlaps the sixth semiconductor region, wherein the overlapping part is the second conductive type. In this case, a pinch off voltage with which a depletion layer extending from the fourth semiconductor region reaches the surface of the second semiconductor region is lower than a breakdown voltage between the fourth semiconductor region and the drain region and a breakdown voltage between the third semiconductor region and the second semiconductor region.

In order to achieve another aspect of the present invention, a method of manufacturing a field effect semiconductor device includes the steps of:

forming a first insulating film with at least one opening portion on a first surface of a first semiconductor substrate of a first conductive type;

forming a first semiconductor region of a second conductive type at the opening portion and a portion of the opening region in the first surface of the first semiconductor substrate;

flattening the first surface of the first semiconductor substrate and a first surface of a second semiconductor substrate of the second conductive type;

performing hydrophilic treatment to the first surfaces of the first and second semiconductor substrates;

bonding the first surfaces of the first and second semiconductor substrates to each other;

performing heat treatment to the bonded semiconductor substrates to form a bonded substrate;

forming trenches extending from a second surface of the first semiconductor substrate opposing to the first surface thereof to the first insulating film in portions other than portions vertically corresponding to the opening portions;

depositing a second insulating film to cover surfaces of the trenches to form semiconductor regions each of which is surrounded by the first insulating film and the second insulating films;

forming a lateral type field effect transistor in a surface portion of each of the semiconductor regions such that a source, a gate and a drain are formed in the portions other than the portion vertically corresponding to the opening portions; and connecting the first semiconductor region to the source such that a same voltage as that applied to the source is applied to the first semiconductor region.

A poly-crystal film may be deposited on the first surface of the first semiconductor substrate to a new first surface thereof before the flattening step and an ion implantation may be performed to the poly-crystal film to form the poly-crystal film of the second conductive type. In forming a lateral type field effect transistor includes, a second semiconductor region of the second conductive type in the surface portion of the each semiconductor region may be formed. In this case, the second semiconductor region is connected to the source such that a same voltage as that applied to the source is applied to the second semiconductor region.

In order to still another aspect of the present invention, a field effect semiconductor device includes a first semiconductor region of a first conductive type, a second semiconductor region of a second conductive type provided above the first semiconductor region, a dielectric film interposed between the first semiconductor region and the second semiconductor region to surround the second semiconductor region, and a field effect transistor composed of a source region provided in a surface portion of the second semiconductor region and connected to a source electrode, a drain region provided in the surface portion of the second semiconductor region and connected to a drain electrode, and a first gate having one of an insulation gate structure and a Junction gate structure, provided between the source region and the drain region to form a channel region. The drain region, the first gate and the source region are preferably provided apart from a portion vertically corresponding to at least one opening portion which is provided in the dielectric film. The field effect semiconductor device further includes an adjusting section for adjusting an electric field distribution in the second semiconductor region using a depletion layer extending from the opening portion.

The first gate may have the Junction gate structure and adjust the electric field distribution in the second semiconductor region using a depletion layer extending from the first gate. Alternatively, when the first gate has the insulation gate structure, a second gate may be provided to have the junction gate structure, and to adjust the electric field distribution in the second semiconductor region using a depletion layer extending from the second gate.

DESCRIPTION OF THE PREFERRED EMBODIMENTS

Next, the high breakdown voltage field effect semiconductor device of the present invention will be described below in detail with reference to the accompanying drawings.

Figure 2:
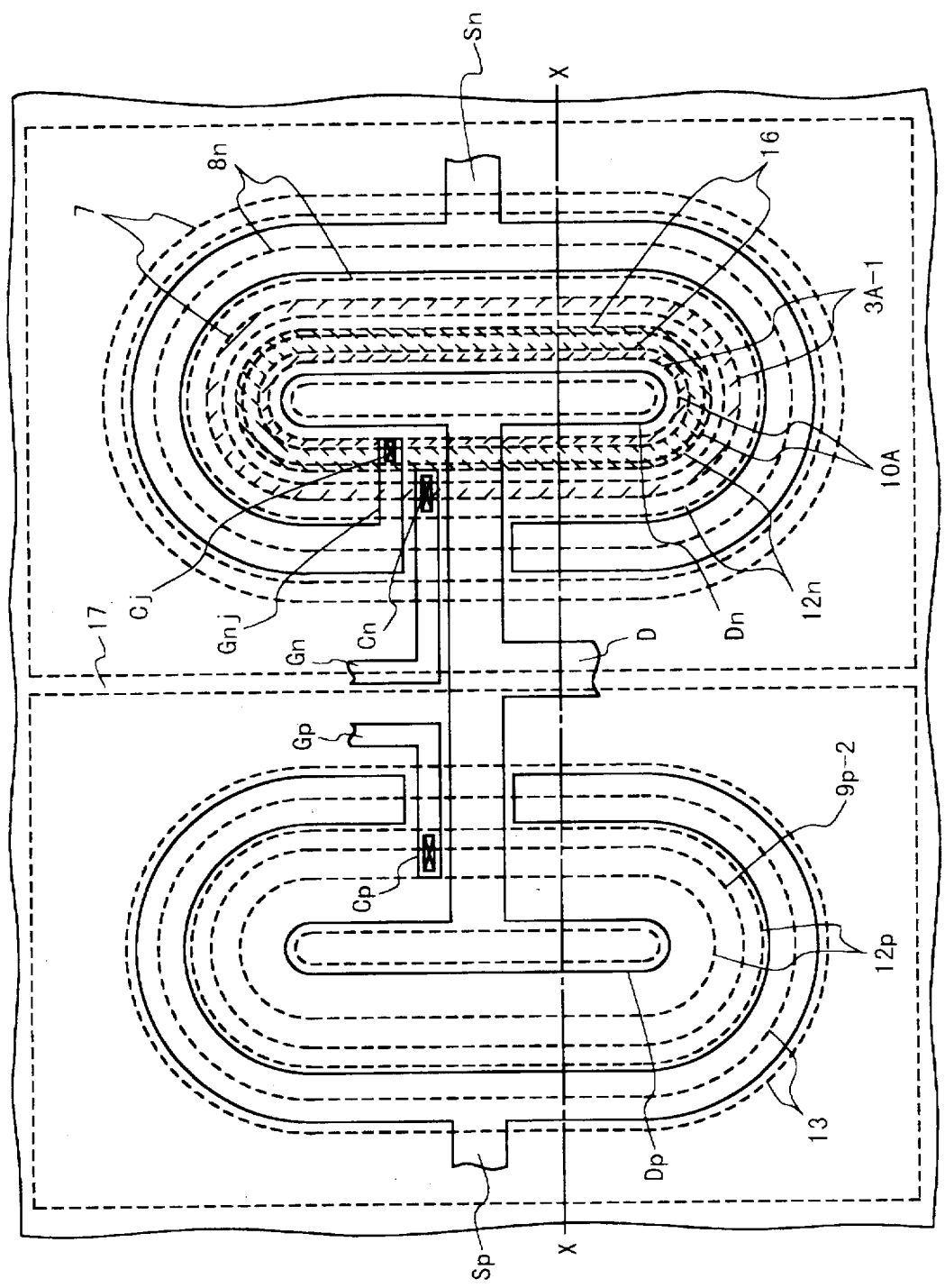
FIG. 2 is a plan view of a high breakdown voltage field effect semiconductor device according to a first embodiment of the present invention.
Figure 3A:
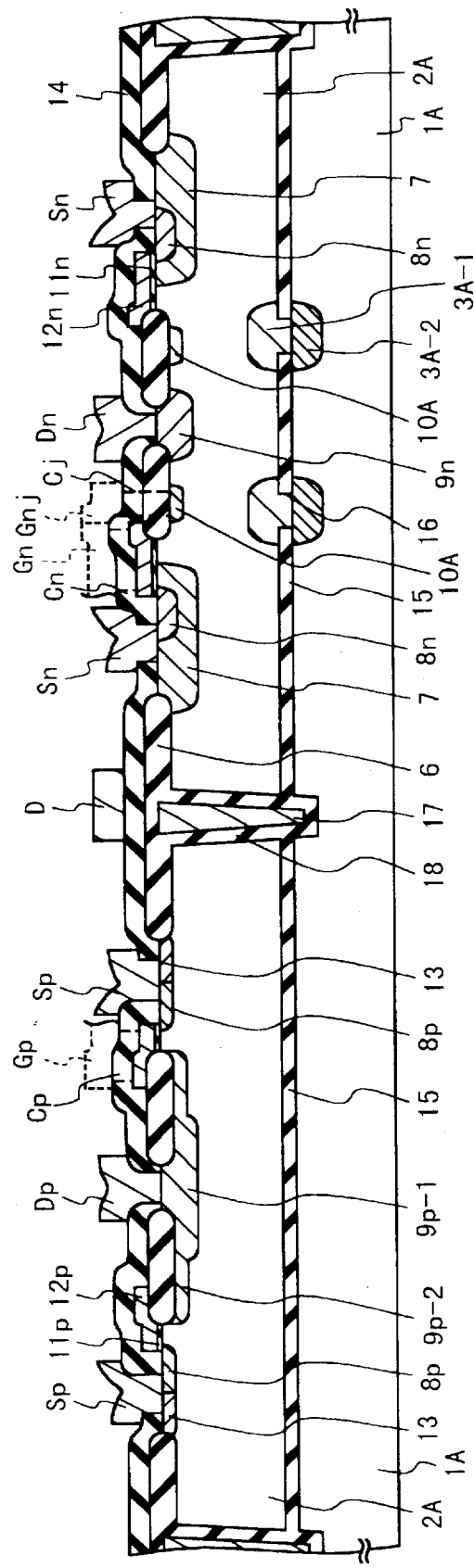
FIG. 3A is a cross sectional view of the semiconductor device according to the first embodiment of the present invention.
Figure 3B:
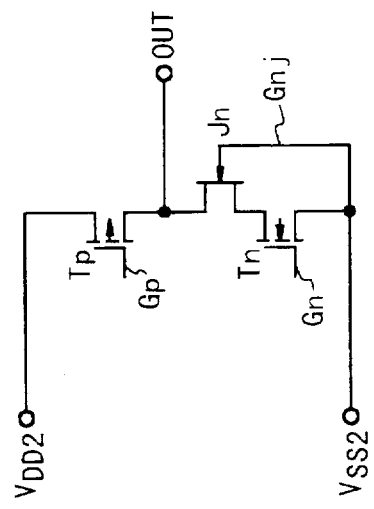
FIG. 3B is a circuit diagram illustrating an equivalent circuit of the semiconductor device shown in FIG. 3A.

FIG. 2 is a plan view of the semiconductor device according to the first embodiment of the present invention. FIG. 3A is a cross sectional view of the semiconductor device of the first embodiment cut along the X—X' line. FIG. 3B is a circuit diagram illustrating an equivalent circuit of the semiconductor device.

As shown in FIG. 2, the semiconductor device is a P-channel type transistor and an N-channel type transistor are formed in two segmented semiconductor regions, respectively. The drain of the P-channel transistor and the drain of the N-channel transistor are connected by a wiring pattern D. Source electrodes $S_p$ and $S_n$ of the transistors are provided around the drains, respectively. Gate wiring patterns $G_p$ and Gn for gate electrodes are provided along the wiring pattern D and connected to the gate electrodes by contacts $C_p$ and $C_n$, respectively. The source electrode $S_n$ of the N-channel transistor extends toward the drain at one end and connected via a contact $C_j$ to a semiconductor region 10A to be described later in detail.

Figure 1A:
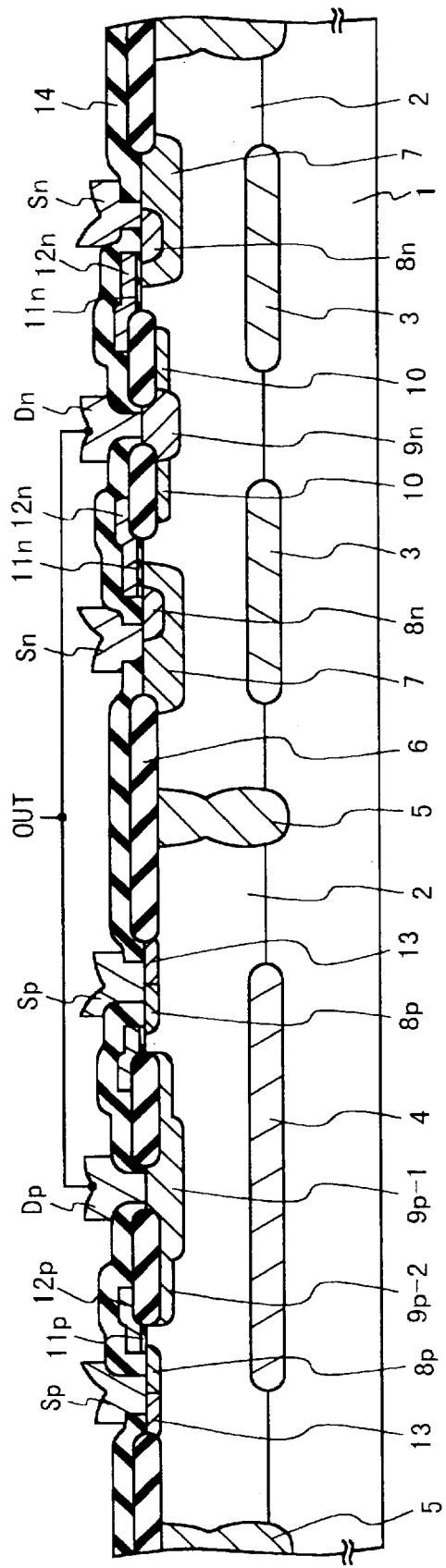
FIG. 1A is a cross sectional view of a conventional lateral double diffused type of high breakdown voltage MOS transistor.
Figure 1B:
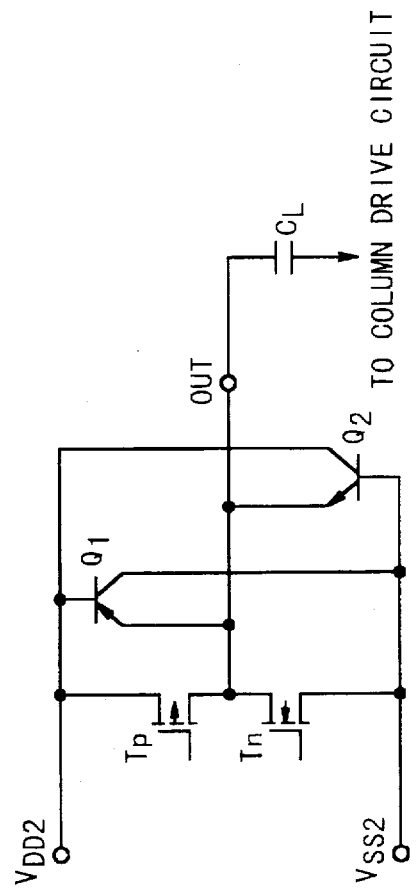
FIG. 1B is a circuit diagram illustrating an equivalent circuit of the conventional MOS transistor shown in FIG. 1A.

Referring to FIG. 3A, a P-channel HVMOS FET $T_p$ in the semiconductor device of the present invention is different from that of the conventional semiconductor device shown in FIG. 1A in that the P-channel HVMOS FET $T_p$ is formed in a region surrounded by trench isolation structures and a silicon oxide film 15. The trench isolation structure is filled with a silicon oxide film 18 formed on the side surfaces and the bottom surface and a polysilicon film 17 formed in the silicon oxide film 18. Because the other basic structure is the same, there is not a detailed explanation once more.

There is a main difference between the semiconductor device of the present embodiment and the conventional semiconductor device shown in FIG. 1A in the N-channel HVLDMOS FET $T_n$. That is, in the semiconductor device according to the first embodiment of the present invention, an N-type silicon region 2A having the thickness of 6 μm and the impurity doping level of $3 \times 10^{15}$ cm$^{-3}$ is provided such that it is surrounded or covered by dielectric films or insulating films such as silicon oxide films 15 and 18 in the side surfaces and a bottom surface. The N-type silicon region 2A is provided on a P-type silicon region 1A via the silicon oxide film 15. The N-type silicon region 2A and the P-type silicon region 1A are connected through opening portions 16 which are provided in the silicon oxide film 15 to have a width of a few micrometers. A P-type channel region 7 is formed in the surface portion of the N-type silicon region 2A so as to avoid a straightly upper portion of the opening portion 16. An N$^+$-type source region 8n is formed on the surface portion of the P-type channel region 7. An N$^+$-type drain region 9n is formed on the surface portion of the N-type silicon region 2A in a higher doping level than that of the N-type silicon region 2A such that it is formed apart from the P-type channel region 7 to avoid the straightly upper portions of the opening potions 16. A part of the surface portion of the N-type silicon region 2A sandwiched by the N$^+$-type source region 8n and the N$^+$-type drain region 9n is covered by a gate electrode 12n via a gate insulting film 11n. A first P-type diffusion layer 3A-1 having the impurity doping level of $1 \times 10^{16}$ cm$^{-3}$ is formed in the opening portions 16 and the peripheral portions of the opening portion in the bottom portion of the N-type silicon region 2A. Also, there is provided means for applying the same voltage to both of the first P-type diffusion layer 3A-1 and the $N^+$-type source region 8n. The source wiring $S_n$ contacts the $N^+$-type source region 8n and is connected to the power supply lower side potential wiring $V_{ss2}$. The first P-type diffusion layer 3A-1 is connected to the P-type diffusion layer 3A-2 which is provided in the P-type silicon region 1A. The P-type silicon region 1A and the N-type silicon region 2A are bonded via the silicon oxide film 15 by the wafer bonding technique. The rear surface of the P-type silicon region 1A is connected to the power supply lower side potential wiring $V_{ss2}$ as well as the source wiring $S_n$. Further, a second P-type diffusion layer 10A is formed in the surface portion of the N-type silicon region 2A apart from the P-type channel region 7, the $N^+$-type drain region 9n and the first P-type diffusion layer 3A-1 at a portion opposing to the first P-type diffusion layer 3A-1. The second P-type diffusion layer 10A has an impurity doping level of $1 \times 10^{16}$ cm$^{-3}$. There is means for applying the same voltage as the first P-type diffusion layer 3A-1 to the second P-type diffusion layer 10A. The means is composed of a junction gate wiring $G_n$ which contacts the second P-type diffusion layers 10A through a hole $C_j$ which penetrates a field oxidation film 6 and an interlayer insulating film 14.

The first P-type diffusion layer 3A-1 and the second P-type diffusion layer 10A of the N-channel HVLDMOS FET $T_n$ in the present embodiment may be considered as the electric field adjusting layer of the conventional semiconductor device described in the above U.S. Pat. No. 4,300,150. When the pinch off voltage $V_p$ with which a depletion layer extending from the first P-type diffusion layer 3A-1 contacts a depletion layer extending from the second P-type diffusion layer 10A is lower than a breakdown voltage $BV_1$ between the p-channel region 7 and the N-type silicon region 2A or a breakdown voltage $BV_2$ between the first P-type diffusion layer 3A-1 and the $N^+$-type drain region 9n, the breakdown voltage BV of the MOSFET $T_n$ is determined based on a breakdown voltage $BV_2$ between the first P-type diffusion layer 3A-1 and the $N^+$-type drain region 9n. In the above conventional semiconductor device, because the P-type diffusion layer 10 in FIG. 1A contacts the $N^+$-type drain region 9n, it is difficult to increase the breakdown voltage. The first P-type diffusion layer 3A-1 may be extended to below the P-type channel region 7 as the P-type diffusion layer 3 as shown in FIG. 1A. Note that the opening portion 16 needs not to be extended. The extension of the first P-type diffusion layer 3A-1 is not necessarily required. As long as the condition of $V_p < BV_1$ is satisfied, the breakdown voltage $BV_1$ is not influenced by the breakdown voltage BV.

a large amount of lattice defects are present in the interface between the single crystal substrate bonded to each other using the wafer bonding technique, compared to an epitaxial bonding interface. However, because the PN-junction plane between the first P-type diffusion layer 3A-1 and the N-type silicon region 2A is apart from the bonding interface, leak current is in a very low level.

Because the N-type silicon region 2A in which the P-channel HVMOS FET $T_p$ is formed is insulated or isolated from the P-type silicon region 1A by the dielectric film such as the silicon oxide film 15, there is no parasitic PNP bipolar transistor $Q_1$, unlike the conventional semiconductor device. Also, because the N-type silicon region 2A in which the P-channel HVMOS FET $T_p$ is formed is insulated or isolated from the N-type silicon region 2A in which N-channel HVMOS FET $T_n$ is formed by the trench isolation structure 17 and 18, there is no parasitic NPN bipolar transistor $Q_2$. Therefore, the above-mentioned problem can be prevented which is caused when the transistors $Q_1$ and $Q_2$ are made conductive.

Note that the second P-type diffusion layer 10A is not necessarily provided. In this case, the pinch off voltage with which the depletion layer extending from the first P-type diffusion layer 3A-1 reaches the field oxidation film is required to be lower than the breakdown voltage between the P-type channel region 7 and the N-type silicon regions 2A.

Next, a first method for manufacturing the field effect semiconductor device of the present invention will be described below.

Figure 4A:
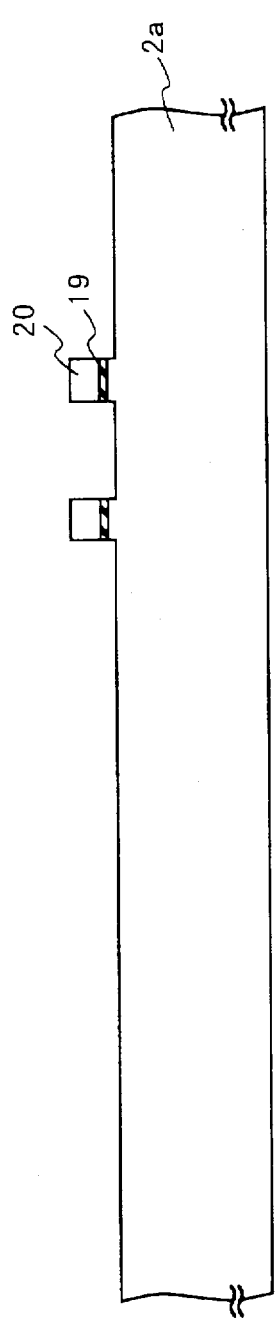
FIGS. 4A to 4G are cross sectional views of the semiconductor device shown in FIG. 3A in a first example of manufacturing method according to the present invention.

First, as shown in FIG. 4A, an oxidation-resistive film 19 is formed on the surface ((100) plane) of an N-type silicon single crystal substrate 2a having the impurity doping level of $3 \times 10^{15}$ cm$^{-3}$. The oxidation-resistive film 19 is a 2-layer film and composed of a pad oxidization film of 50 nm in thick and a silicon nitride film of 200 nm in thick. A photo-resist film 20 is formed on the oxidation-resistive film 19 and the oxidation-resistive film 19 is patterned using the photo-resist film 20 as a mask by lithography technique such that a pattern corresponding to a desired portion for the opening portions 16 to be formed is left. In this case, a small step may be formed on the N-type single crystal silicon substrate 2a by etching the surface of the N-type silicon substrate 2a.

Figure 4B:
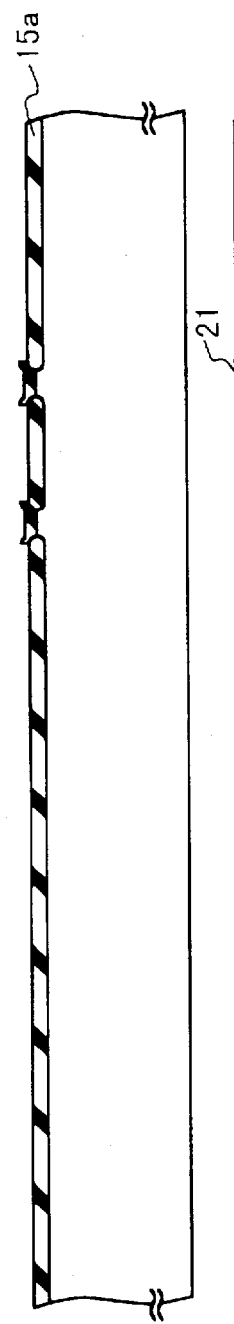
Figure 4C:
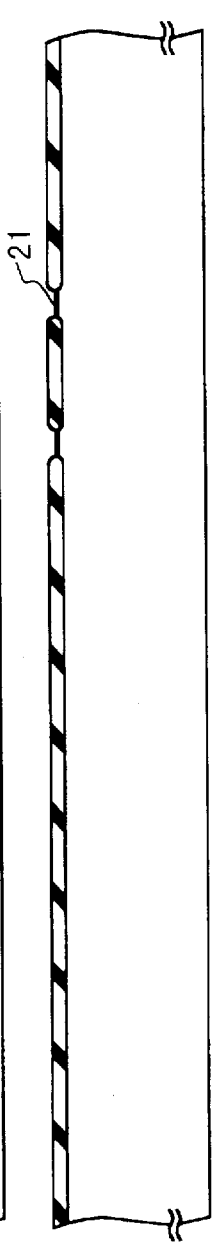

Next, the patterned photo-resist film 20 is removed, and then thermal oxidation is performed to form a silicon oxide film 15a having the thickness of about 1 μm, as shown in FIG. 4B. Subsequently, boron is implanted by an ion implantation method using the silicon oxide film 15a as a mask so that boron implantation regions 21 are formed in the portion which are not covered by the silicon oxide film 15a, as shown in FIG. 4C. Then, lamp annealing is performed. In this state, the boron implantation regions 21 are formed to recess from the surface of the silicon oxide film 15a.

Figure 4D:
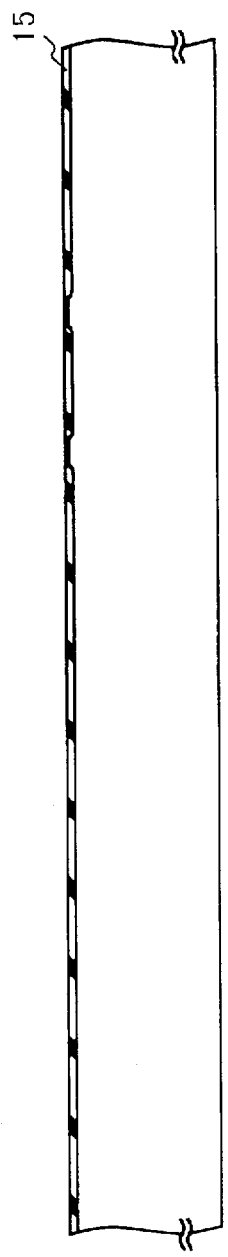

Next, chemical mechanical polishing is performed such that the N-type silicon substrate 2a does not almost have any step between the surface of the boron implantation regions 21 and the surface of the silicon oxide film 15a, as shown in FIG. 4D. As a result, the silicon oxide film 15 with the thickness of 600 nm is left.

Figure 4E:
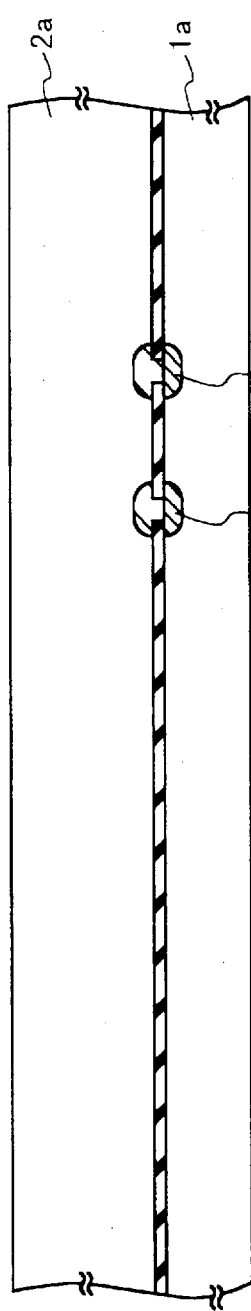

Next, the N-type silicon substrate 2a is bonded to a P-type single crystal silicon substrate 1a having the surface of the (100) plane as shown in FIG. 4E. For the bonding, hydrophilic processing is performed to form silnol radicals on the silicon surfaces to be bonded of both of the N-type silicon substrate 2a and the P-type silicon substrate 1a using a mixture solution of $H_2O_2$ or $H_2SO_4$, as described in Japanese Laid Open Patent Disclosure (Heisei 4-29353). Then, the N-type silicon substrate 2a and P-type silicon substrate 1a are bonded to each other such that both are tightly fit. The N-type silicon substrate 2a and P-type silicon substrate 1a are both subjected to heat treatment of 1100° C. for 2 hours in the fit state. By the heat treatment, boron ions are diffused from the boron ion implantation region 21 to form the P-type diffusion layers 3A-1 and 3A-2 (strictly, the original forms). Subsequently, the CMP method is applied to thin the N-type single crystal substrate 2a so as to have the thickness of about 6 μm. As a result, the N-type silicon region 2A is formed.

Figure 4F:
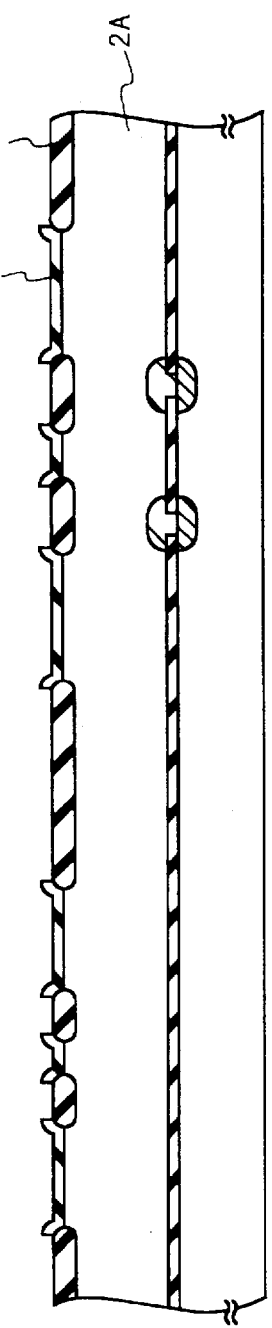

Next, as shown in FIG. 4F, an oxidation resistive layer 22 is formed on the N-type silicon region 2A. Then, heat treatment is performed to form the field oxidation film 6 of about 1.0 μm in thick.

Figure 4G:
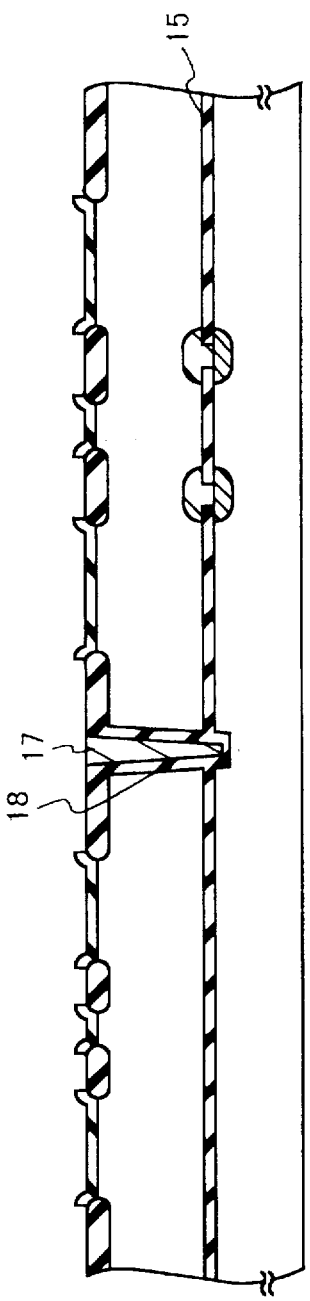

Next, as shown in FIG. 4G, the trench is formed which reaches at least the silicon oxide film 15 from a desired portion of the field oxidation film 6. Subsequently, a silicon oxide film 18 is formed to have the thickness of 400 nm. At this time, a small trench is remained. Then, the remained trench is filled with polysilicon film 17. Alternatively, the remained trench may be filled with a BPSG film. For this purpose, well known trench separation technique can be applied. The following processes can be performed to complete the structure as shown in FIGS. 2 to 3B in the same manner as in the prior high breakdown voltage CMOS.

Next, the second method of manufacturing the high breakdown voltage semiconductor device will be described below in detail with reference to FIGS. 5A to 5E.

Figure 5A:
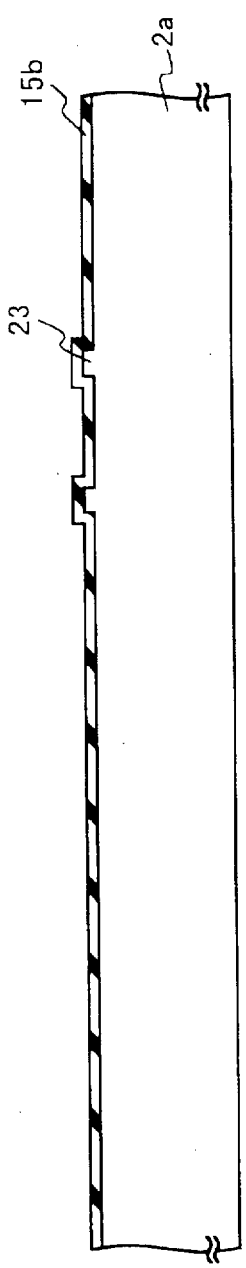
FIGS. 5A to 5E are cross sectional views of the semiconductor device shown in FIG. 3A in a second example of manufacturing method according to the present invention.

As shown in FIG. 5A, first, a silicon oxide film (not shown) is formed on a main surface, i.e., (100) plane of the N-type single crystal silicon substrate 2a having an impurity doping level of $3 \times 10^{15}$ cm$^{-3}$ by an oxidation method such as heat treatment to have a uniform film thickness. Then, the silicon oxide film is removed partially from desired portions by applying a photo-lithography method and dry etching method to exposes the single crystal silicon surface of the desired portions. Subsequently, the exposed single crystal silicon surface is etched using the remained silicon oxide film as a mask so as to form a small step. In this manner, ring-like protrusion portions 23 are formed in portions where the openings 16 are to be formed. Next, after the silicon oxide film which has been used as the mask is removed an insulating film 15b is formed on the whole surface to have a uniform film thickness. The insulating film 15b may be a silicon oxide film (SiO$_2$) formed by thermal oxidation or low temperature CVD, or a silicon nitride film (Si$_3$N$_4$) formed by low temperature CVD. The film thickness of the insulating film 15b is as thick as the small step is eliminated. The height of the small step on the substrate and the film thickness of the insulating film are in a range of from a few hundreds of nano-meters to a few micro-meters and selected in accordance with a required separation breakdown voltage.

Figure 5B:
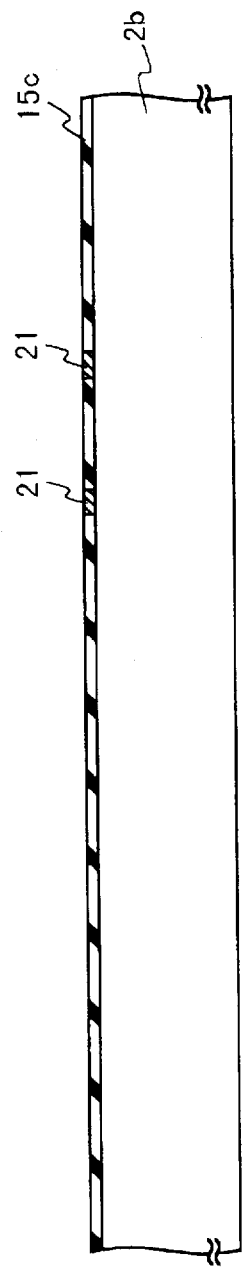

Next, as shown in next FIG. 5B, the insulating film on protrusion portions 23 are removed by polishing and grinding or etching and so on such that the N-type single crystal silicon substrate 2a surface is exposed in the protrusion portions 23. At this time, the exposed surface of the N-type single crystal silicon substrate 2a is approximately flat to the surface of the insulating film 15b. Subsequently, the surfaces of the single crystal silicon and insulating film 15b are flattened such that the step or micro-roughness over the surfaces of the single crystal silicon and insulating film 15b is a few tens of nano-meters at maximum. For adjusting the micro-roughness, there may be used a polishing method selectively acting either one of the single crystal silicon and the insulating film, or an any method in which both can be abraded at the same rate. In this case, the insulating film remained after the polishing has the film thickness of about 600 nm. Thereafter, boron implantation regions 21 are formed by an ion implantation method and then lamp annealing is performed.

Figure 5C:
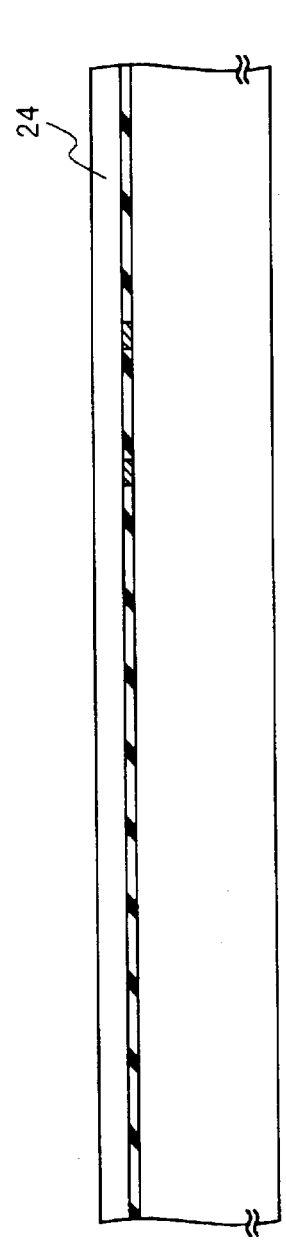
Figure 5D:
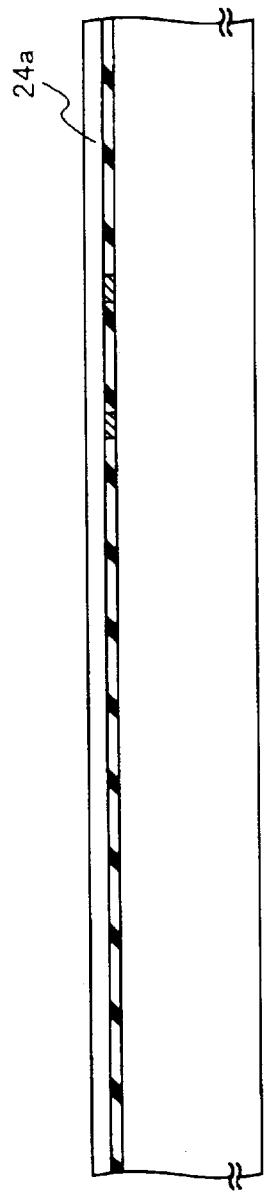
Figure 5E:
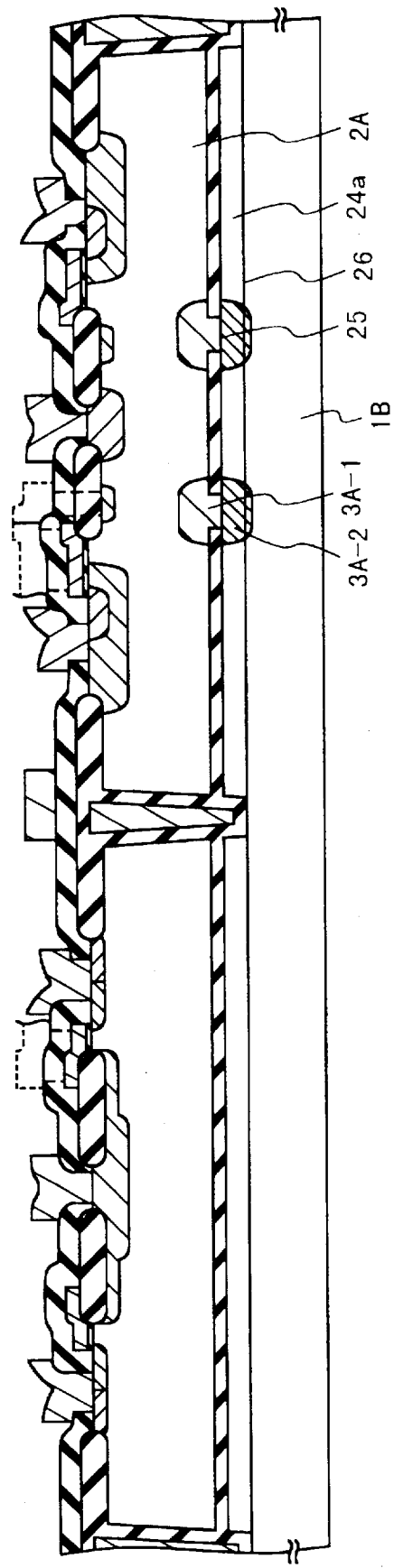

Next, as shown in FIG. 5C, the polysilicon layer 24 is formed by the CVD method and so on. The polysilicon layer 24 is desirable to have the thickness of 1 to 3 μm such that the polysilicon layer 24 can eliminate the micro-roughness of about a few tens of nano-meters and can have a thickness margin in flattening of the surface by polishing. Subsequently, the polysilicon layer 24 is flattened by the polishing to have an extremely flat surface of the step or micro-roughness of a few nano-meters at maximum.

Because the polishing is performed to the surface of the polysilicon film 24, a CMP method can be applied for the polishing. Thereafter, impurity ions are introduced in the polysilicon layer 24 by an ion implantation or diffusion method so that the polysilicon layer 24a is made conductive. The introduction of impurity ions may be performed before the polysilicon film 24 is polished.

Next, as in the first manufacturing method, hydrophilic treatment is performed to a main plane of the P-type single crystal silicon substrate and the surface of the polysilicon film 24a which is formed on the main place of the N-type single crystal silicon substrate and has the extremely flat surface. Subsequently, the surfaces subjected to the hydrophilic treatment are tightly fit and then heat treatment is performed for about 2 hours at a temperature in a range of 1100° to 1200° C. In this manner, one multi-substrate in which two substrates are strictly coupled or adhered to each other can be obtained. Thereafter, the structure shown in FIG. 5E can be realized in the same manner as in the first method. The semiconductor device manufactured by the second method is different from that shown in FIG. 3A in that the P-type silicon region 1A is composed of the P-type single crystal silicon substrate 1B and the polysilicon layer 24a adhered to the single crystal silicon substrate 1B. In this structure, leak current can be further reduced because the distance between the PN junction of the P-type diffusion layer 3A-1 and the N-type silicon region 2A and the adhesion surface is farther compared to the semiconductor device manufactured by the first method and the polysilicon layer 24a changes to a single crystal in the vicinity of the single crystal silicon through the adhering process and the subsequent thermal treatment process.

In the second manufacturing method, Polysilicon Sandwiched wafer Bonding (PSB) technique is applied which is described in a paper (Proceedings of 1995 International Synposium on Power Semiconductor Devices & ICs, pp. 58–62). In the first manufacturing method, because the surface region is composed the silicon oxide film and silicon, it is difficult to flatten the surface region such that the micro-roughness to equal to or less than 10 nm. As a result, voids are easy to be generated in the bonding surface. On the other hand, in the second manufacturing method, because the surfaces to be bonded are the silicon surfaces so that the flatness is superior, the generation of voids can be prevented and the manufacturing yield and reliability can be increased.

Figure 6:
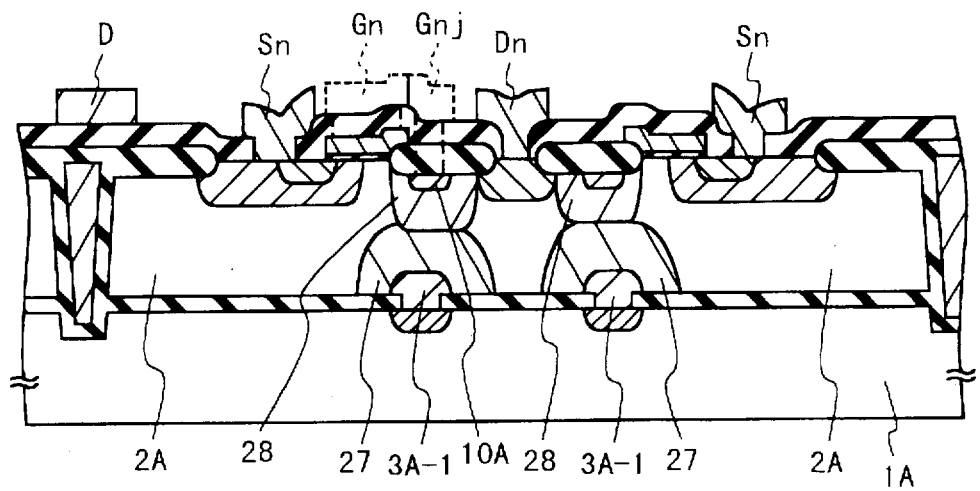
FIG. 6 is a cross sectional view of the semiconductor device according to a second embodiment of the present invention.

FIG. 6 is the cross sectional view illustrating the structure of the high breakdown voltage semiconductor device according to the second embodiment of the present invention. In the semiconductor device of the second embodiment, the first P-type diffusion layer 3A-1 of the N-channel HVLDMOS FET T$_n$ is surrounded by the P$^-$-type diffusion layer 27 and the second P-type diffusion layer 10A is surrounded by the N-type diffusion layer 28 whose impurity concentration is higher than that of the N-type silicon region 2A. In this case, impurity doping level is adjusted in advance such that the portion where the N-type diffusion layer 28 and the P$^-$-type diffusion layer 27 overlap becomes an N-type region and has substantially the same conductivity as that in the N-type diffusion layer 28 other than the overlapping portion. The thickness of the N-type region between the P-type regions is determined based on size of the N-type diffusion layer 28. Therefore, there is the advantage in that the thickness of the N-type region is not influenced due to variation of the N-type silicon region 2A in thickness and as a result of this a distribution of breakdown voltages can be made small.

In a manufacturing method, an original region of the P$^-$-type diffusion layer 27 is formed using an ion implantation and forced diffusion before forming the boron implantation layer 21. Then, the boron implantation layer 21 is formed. Further, an original region of the N-type diffusion layer 28 is formed using, for example, an ion implantation method and a forced diffusion method before the second P-type diffusion layer 10A is formed. Note that the PSB technique can be applied as in the first embodiment.

Figure 7:
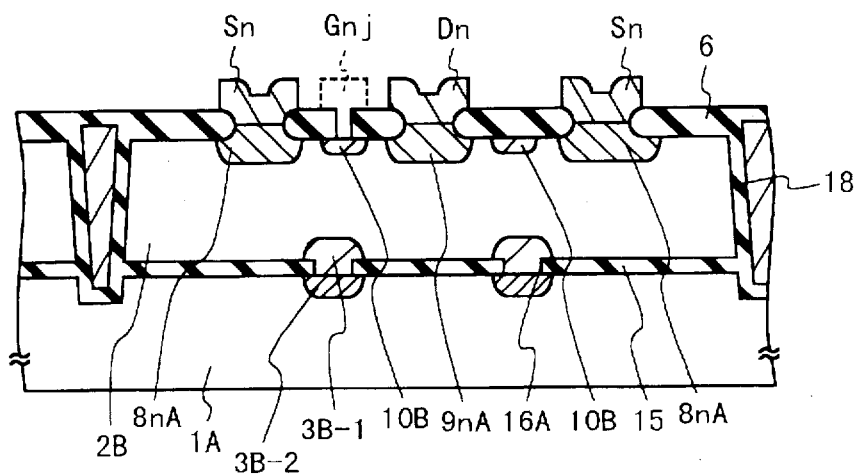
FIG. 7 is a cross sectional view of the semiconductor device according to a third embodiment of the present invention.

FIG. 7 is the cross sectional view illustrating the structure of the high breakdown voltage semiconductor device according to the third embodiment of the present invention. The semiconductor device in the third embodiment is different from that of the first embodiment in that the P-type channel region 7 and the gate electrode 12n are not provided and the junction gate electrode $G_{nj}$ is not connected to the source electrode $S_n$ but formed independently as the gate electrode. That is, the semiconductor device in the third embodiment includes a junction type field effect transistor (FET) composed of the N-type silicon region 2B which is covered by the insulating film (the silicon oxide films 15 and 18) in the bottom surface and side surfaces and provided in the surface portion. A semiconductor substrate includes the P-type silicon region 1A which is connected to the bottom portion of the N-type silicon region 2B at the opening portions 16A which are provided for the silicon oxide film 15. A pair of N$^+$-type diffusion layers 8nA and 9nA as the source and drain regions is formed in the surface portion with an impurity doping level higher than the N-type silicon region 2B such that a straightly upper portion of the opening portion 16A is sandwiched by the N$^+$-type diffusion layers 8nA and 9nA. The first junction gate region of the P-type diffusion layer 10B is formed in the surface portion in the N-type silicon region 2B in the straightly upper portion of the opening portion 16A. The second gate region of the P-type diffusion layer 3B-1 is formed the opening portions 16A and the peripheral portions in the bottom portion of the N-type silicon region 2B. The breakdown voltage of the semiconductor device is determined based on the breakdown voltage between the N$^+$-type diffusion layer 9nA as the drain region and the P-type diffusion layer 10B or 3B-1. Because the semiconductor device does not have the insulation gate structure, the breakdown voltage can be easily made higher and the semiconductor device is well suited for the dielectric separation structure.

In the above description, in a case where control logic is formed to have the CMOS structure, NMOS transistors and PMOS transistors of the control logic is preferably formed in a silicon region separated by dielectric substance as in the P-channel HVMOS FET $T_p$. In this case, it will be understood to a person in the art that the control logic is strong against latch-up.

In the present invention, the first P-type diffusion layer is not provided, the depletion layer will extend from the opening portion 16.

As described above, according to the present invention, there is used a semiconductor substrate composed of the first conductive type semiconductor region and the second conductive type semiconductor region which are bonded via an insulating film having the opening portions. Also, a second conductive diffusion layer is provided in the opening portions and the peripheral the first conductive type semiconductor region and used an electric field adjusting layer or a part of a junction gate. Therefore, the high breakdown voltage FET is well suited to the dielectric separation structure. In this manner, the semiconductor device having such a high breakdown voltage FET is not influenced by a parasitic bipolar transistor.

What is claimed is:

1. A field effect semiconductor device comprising:

a first semiconductor region of a first conductive type;

a second semiconductor region of a second conductive type provided above said first semiconductor region, said second conductive type opposite that of said first conductive type;

a dielectric film interposed between said first semiconductor region and said second semiconductor region to surround said second semiconductor region on side and bottom portions of said second semiconductor region with at least one opening portion for connecting said second semiconductor region to said first semiconductor region;

a source region provided in a surface portion of said second semiconductor region and connected to a source electrode;

a drain region provided in the surface portion of said second semiconductor region and connected to a drain electrode; and a channel region of said first conductive type which surrounds at least one of said source region and said drain region.

2. A field effect semiconductor device according to claim 1, wherein said drain region and said source region are provided apart from a portion vertically corresponding to said opening portion.

3. A field effect semiconductor device according to claim 2, wherein said gate electrode is provided on the surface portion of said second semiconductor region via a gate insulating film, and wherein said source region is said second conductive type, and wherein said field effect semiconductor device further comprises a third semiconductor region of said first conductive type connected to said source electrode and provided in the surface portion of said second semiconductor region such that said source region is surrounded by said third semiconductor region and such that said third semiconductor region extends below said gate electrode.

4. A field effect semiconductor device according to claim 2, further comprising a third semiconductor region of said first conductive type provided at said opening portion and in a peripheral portion of said opening portion.

5. A field effect semiconductor device according to claim 4, wherein a gate electrode is provided on the surface portion of said second semiconductor region via a gate insulating film, and wherein said source region is said second conductive type, and wherein said channel region of said field effect semiconductor device further comprises a fourth semiconductor region of said first conductive type connected to said source electrode and provided in the surface portion of said second semiconductor region such that said source region is surrounded by said fourth semiconductor region and such that said fourth semiconductor region extends below said gate electrode, and said field effect semiconductor device includes means for applying a same voltage as said source electrode to said third semiconductor region.

6. A field effect semiconductor device according to claim 5, wherein a pinch off voltage with which a depletion layer extending from said third semiconductor region reaches the surface of said second semiconductor region is lower than a breakdown voltage between said third semiconductor region and said drain region and a breakdown voltage between said fourth semiconductor region and said second semiconductor region.

7. A field effect semiconductor device according to claim 5, further comprising:
   a fifth semiconductor region of said first conductive type provided in the surface portion of said second semiconductor region vertically corresponding to said third semiconductor region; and
   means for connecting said fifth semiconductor region to said source electrode.

8. A field effect semiconductor device according to claim 7, wherein a pinch off voltage with which a depletion layer extending from said third semiconductor region reaches the surface of said second semiconductor region is lower than a breakdown voltage between said third semiconductor region and said drain region and a breakdown voltage between said fourth semiconductor region and said second semiconductor region.

9. A field effect semiconductor device according to claim 7, further comprising:
   a sixth semiconductor region of said first conductive type provided in said second semiconductor region such that said third semiconductor region is surrounded by said sixth semiconductor region; and
   a seventh semiconductor region of said second conductive type provided in said second semiconductor region such that said fifth semiconductor region is surrounded by said seventh semiconductor region and such that a part of said seventh semiconductor region overlaps said sixth semiconductor region, wherein said overlapping part is said second conductive type.

10. A field effect semiconductor device according to claim 9, wherein a pinch off voltage with which a depletion layer extending from said third semiconductor region reaches the surface of said second semiconductor region is lower than a breakdown voltage between said third semiconductor region and said drain region and a breakdown voltage between said fourth semiconductor region and said second semiconductor region.

11. A field effect semiconductor device according to claim 4, further comprising means for applying a same voltage as said source electrode to said third semiconductor region.

12. A field effect semiconductor device according to claim 11, wherein a pinch off voltage with which a depletion layer extending from said third semiconductor region reaches the surface of said second semiconductor region is lower than a breakdown voltage between said third semiconductor region and said drain region.

13. A field effect semiconductor device according to claim 11, further comprising:
   a fifth semiconductor region of said first conductive type provided in the surface portion of said second semiconductor region vertically corresponding to said third semiconductor region; and
   means for connecting said fifth semiconductor region to said source electrode.

14. A field effect semiconductor device according to claim 13, wherein a pinch off voltage with which a depletion layer extending from said third semiconductor region reaches a depletion layer extending from said fifth semiconductor region is lower than a breakdown voltage between said third semiconductor region and said drain region.

15. A field effect semiconductor device comprising:
   a first semiconductor region of a first conductive type;
   a second semiconductor region of a second conductive type provided above said first semiconductor region, said second conductive type opposite that of said first conductive type;
   a dielectric film interposed between said first semiconductor region and said second semiconductor region to surround said second semiconductor region on side and bottom portions of said second semiconductor region with at least one opening portion for connecting said second semiconductor region to said first semiconductor region;
   a field effect transistor composed of a source region provided in a surface portion of said second semiconductor region and connected to a source electrode, a drain region provided in the surface portion of said second semiconductor region and connected to a drain electrode, a first gate having one of an insulation gate structure and a junction gate structure, provided between said source region and said drain region, and a channel region of said first conductive type formed to surround at least one of said source region and said drain region;
   wherein said drain region, said first gate and said source region are provided apart from a portion vertically corresponding to said at least one opening portion provided in said dielectric film; and
   adjusting means for adjusting an electric field distribution in said second semiconductor region using a depletion layer extending from said opening portion.

16. A field effect semiconductor device according to claim 15, wherein said first gate has the junction gate structure and adjusts the electric field distribution in said second semiconductor region using a depletion layer extending from said first gate.

17. A field effect semiconductor device according to claim 15, wherein said first gate has the insulation gate structure and said field effect semiconductor device further comprises a second gate having the junction gate structure, for adjusting the electric field distribution in said second semiconductor region using a depletion layer extending from said second gate.

18. A field effect semiconductor device comprising:
   a first semiconductor region of a first conductive type;
   a second semiconductor region of a second conductive type, said second conductive type opposite that of said first conductive type, provided above said first semiconductor region, said second semiconductor region having a first half and a second half;
   a dielectric film interposed between said first semiconductor region and said second semiconductor region to surround and separate both said first half and said second half of said second semiconductor region from each other and from said first semiconductor region, with at least one opening portion for connecting said first half of said second semiconductor region to said first semiconductor region;
   a first field effect transistor composed of a first source region provided in a surface portion of said first half of said second semiconductor region and connected to a first source electrode, a first drain region provided in the surface portion of said first half of said second semiconductor region and connected to a first drain electrode, a first gate having one of an insulation gate structure and a junction gate structure, provided between said first source region and said first drain region, and a first channel region of said first conductive type formed to surround at least one of said first source region and said first drain region;

wherein said first drain region, said first gate and said first source region are provided apart from a portion vertically corresponding to said at least one opening portion provided in said dielectric film; and a second field effect transistor composed of a second source region provided in a surface portion of said second half of said second semiconductor region and connected to a second source electrode, a second drain region provided in the surface portion of said second half of said second semiconductor region and connected to a second drain electrode, a second gate having one of an insulation gate structure and a junction gate structure, provided between said second source region and said second drain region, and a second channel region of said second conductive type formed to surround at least one of said second source region and said second drain region.

* * * * *